United States Patent
Kang et al.

(10) Patent No.: US 10,338,449 B2
(45) Date of Patent: Jul. 2, 2019

(54) DISPLAY APPARATUS AND METHOD OF MANUFACTURING THE SAME

(71) Applicant: Samsung Display Co., Ltd., Yongin-si, Gyeonggi-do (KR)

(72) Inventors: Jaewook Kang, Yongin-si (KR); Sangyoun Han, Yongin-si (KR); Kyungseop Kim, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/628,252

(22) Filed: Jun. 20, 2017

(65) Prior Publication Data

US 2018/0011385 A1 Jan. 11, 2018

(30) Foreign Application Priority Data

Jul. 5, 2016 (KR) .......................... 10-2016-0085071

(51) Int. Cl.

| G02F 1/153 | (2006.01) |
|---|---|
| G02F 1/157 | (2006.01) |
| H01L 27/32 | (2006.01) |
| H01L 51/52 | (2006.01) |
| B81C 1/00 | (2006.01) |
| H01L 51/00 | (2006.01) |
| H05B 33/14 | (2006.01) |

(Continued)

(52) U.S. Cl.
CPC .......... *G02F 1/157* (2013.01); *B81C 1/00246* (2013.01); *B81C 1/00793* (2013.01); *B81C 1/00801* (2013.01); *C09K 11/06* (2013.01); *G02F 1/153* (2013.01); *G06F 3/0412* (2013.01); *H01L 27/326* (2013.01); *H01L 27/3246* (2013.01); *H01L 27/3272* (2013.01); *H01L 51/0094* (2013.01); *H01L 51/5237* (2013.01); *H01L 51/5271* (2013.01); *H01L 51/5281* (2013.01); *H05B 33/14* (2013.01); *B81B 2201/047* (2013.01); *G06F 2203/04103* (2013.01)

(58) Field of Classification Search
CPC . G02F 1/157; H01L 27/3246; H01L 27/3272; H01L 51/5281
USPC ........................................................ 257/40
See application file for complete search history.

(56) References Cited

U.S. PATENT DOCUMENTS 8,362,469 B2 * 1/2013 Suh ..................... H01L 27/3279
257/40
2007/0257254 A1 * 11/2007 Yang ................... H01L 27/3269
257/40

(Continued)

FOREIGN PATENT DOCUMENTS

| KR | 10-2003-0024095 | 3/2003 |
| KR | 10-2009-0092484 | 9/2009 |

(Continued)

*Primary Examiner* — Matthew E Warren
(74) *Attorney, Agent, or Firm* — Innovation Counsel LLP

(57) ABSTRACT

A display apparatus includes: a substrate; a pixel electrode above the substrate; a first low reflection layer spaced apart from the pixel electrode at a same layer as the pixel electrode and comprising a lower layer having conductivity and an upper layer above the lower layer; a pixel-defining layer above the first low reflection layer and having an opening exposing at least a part of the pixel electrode; an intermediate layer above the pixel electrode and comprising an organic emission layer; and an opposite electrode above the intermediate layer.

14 Claims, 19 Drawing Sheets

(51) Int. Cl.
*C09K 11/06* (2006.01)
*G06F 3/041* (2006.01)

(56) References Cited

U.S. PATENT DOCUMENTS

| | | | |
|---|---|---|---|
| 2009/0033215 A1* | 2/2009 | Horikiri | H01L 27/3246 313/504 |
| 2015/0363030 A1 | 12/2015 | Nam et al. | |
| 2016/0093680 A1* | 3/2016 | Paek | H01L 27/3246 257/40 |
| 2016/0181334 A1* | 6/2016 | Yang | H01L 27/3246 257/40 |

FOREIGN PATENT DOCUMENTS

| | | |
|---|---|---|
| KR | 10-2015-0020929 | 2/2015 |
| KR | 10-2016-0021353 | 2/2016 |

* cited by examiner

DISPLAY APPARATUS AND METHOD OF MANUFACTURING THE SAME

CROSS-REFERENCE TO RELATED APPLICATION

This application claims the benefit of Korean Patent Application No. 10-2016-0085071, filed on Jul. 5, 2016, in the Korean Intellectual Property Office, the disclosure of which is incorporated herein in its entirety by reference.

BACKGROUND

1. Field

One or more example embodiments relate to a display apparatus and a method of manufacturing the display apparatus.

2. Description of the Related Art

A display apparatus for displaying images is manufactured over an array substrate on which patterns are formed, the patterns including thin film transistors (TFTs), capacitors, and wires connecting the TFTs and the capacitors.

The display apparatus is used in various environments. When the display apparatus is used outdoors or bright indoors, a contrast ratio of an image is reduced due to external light reflected from metals including wires and electrodes that are included in the display apparatus, which causes deterioration in visibility.

To prevent the reflection of the external light, the display apparatus includes various types of anti-reflectors.

SUMMARY

A display apparatus according to the related art includes anti-reflectors such as a black matrix, a color filter, and/or a circular polarizer. However, the display apparatus according to the related art includes separate layers to prevent reflection, which causes an increase in the number of processes, an increase in a thickness thereof, and an occurrence of a color shift according to a viewing angle.

To solve several problems including the aforementioned problem, the present disclosure provides a display apparatus including a low reflection layer without a separate mask process, thereby reducing the number of processes, a thickness thereof, and occurrence of a color shift according to a viewing angle, and a method of manufacturing the display apparatus.

Additional aspects will be set forth in part in the description that follows and, in part, will be apparent from the description, or may be learned by practice of the presented example embodiments.

According to one or more example embodiments, a display apparatus includes: a substrate; a pixel electrode above the substrate; a first low reflection layer spaced apart from the pixel electrode at a same layer as the pixel electrode and including a lower layer having conductivity and an upper layer above the lower layer; a pixel-defining layer above the first low reflection layer and having an opening exposing at least a part of the pixel electrode; an intermediate layer above the pixel electrode and including an organic emission layer; and an opposite electrode above the intermediate layer.

A height of the first low reflection layer may be greater than a height of the pixel electrode.

The upper layer of the first low reflection layer may include a plurality of layers having different refractive indexes.

Light reflected from a boundary surface between the pixel-defining layer and an uppermost layer among the plurality of layers and light reflected from a boundary surface between the plurality of layers may destructively interfere with each other.

The reflectance of the upper layer of the first low reflection layer may be less than about 6%.

The display apparatus may further include: a low reflection etching layer between the pixel-defining layer and an edge of the pixel electrode, wherein the pixel-defining layer covers the edge of the pixel electrode.

The upper layer of the first low reflection layer may include a stack structure of aluminum (Al)/aluminum oxide ($AlO_x$)/titanium (Ti), a stack structure of aluminum (Al)/titanium (Ti)/indium zinc oxide (IZO)/titanium (Ti), or a stack structure of copper (Cu)/indium tin oxide (ITO)/copper oxide ($Cu_2O$).

The first low reflection layer may be electrically grounded.

The display apparatus may further include: a thin film encapsulation layer above the opposite electrode and including at least one inorganic layer and at least one organic layer; and a touch panel above the thin film encapsulation layer.

The touch panel may include: a detection electrode detecting a touch signal and including a plurality of conductive lines in a grid shape; a second low reflection layer spaced apart from the detection electrode at a same layer as the detection electrode and surrounding the pixel electrode; a bridge overlapping a part of the detection electrode on a plane, including a plurality of conductive lines in a grid shape, and electrically connected to the detection electrode; and an insulating layer between the bridge and the detection electrode and having an opening through which the bridge and the detection electrode are electrically connected to each other.

Widths of the plurality of conductive lines included in the detection electrode may be less than widths of the plurality of conductive lines included in the bridge.

The detection electrode and the second low reflection layer may include a plurality of layers having refractive indexes, wherein lights reflected from boundary surfaces of the plurality of layers destructively interfere with each other.

The detection electrode and the second low reflection layer may include a stack structure of aluminum (Al)/aluminum oxide ($AlO_x$)/titanium (Ti), a stack structure of aluminum (Al)/titanium (Ti)/indium zinc oxide (IZO)/titanium (Ti), or a stack structure of copper (Cu)/indium tin oxide (ITO)/copper oxide ($Cu_2O$).

The bridge may include a plurality of layers having refractive indexes, wherein lights reflected from boundary surfaces of the plurality of layers may destructively interfere with each other.

According to one or more example embodiments, a method of manufacturing a display apparatus includes: sequentially forming a conductive layer and a low reflection layer above a substrate; forming a first low reflection layer including a lower layer having conductivity and an upper layer above the lower layer, a pixel electrode, and a low reflection etching layer above the pixel electrode by patterning the conductive layer and the low reflection layer; forming a pixel-defining layer above the first low reflection layer and having an opening exposing at least a part of the low reflection etching layer; exposing the pixel electrode by etching at least a part of the low reflection etching layer by using the pixel-defining layer as a mask; forming an intermediate layer above the exposed pixel electrode, the intermediate layer including an organic emission layer; and forming an opposite electrode above the intermediate layer.

The forming of the low reflection layer may include sequentially stacking a plurality of layers having different refractive indexes.

The upper layer of the first low reflection layer may include a stack structure of aluminum (Al)/aluminum oxide ($AlO_x$)/titanium (Ti), a stack structure of aluminum (Al)/titanium (Ti)/indium zinc oxide (IZO)/titanium (Ti), or a stack structure of copper (Cu)/indium tin oxide (ITO)/copper oxide ($Cu_2O$).

The method may further include: after the forming of the opposite electrode, forming a thin film encapsulation layer above the opposite electrode, the thin film encapsulation layer including at least one inorganic layer and at least one organic layer; and forming a touch panel above the thin film encapsulation layer.

The forming of the touch panel may include: forming a detection electrode detecting a touch signal and including a plurality of conductive lines in a grid shape, and a second low reflection layer surrounding the pixel electrode; forming an insulating layer having an opening exposing a part of the detection electrode above the detection electrode and the second low reflection layer; and forming a bridge including a plurality of conductive lines in a grid shape, covering the opening of the insulating layer, and electrically connected to the detection electrode above the insulating layer.

The forming of the detection electrode and the second low reflection layer may include sequentially stacking a plurality of layers having different refractive indexes, wherein lights reflected from boundary surfaces of the plurality of layers destructively interfere with each other.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Figure 1:
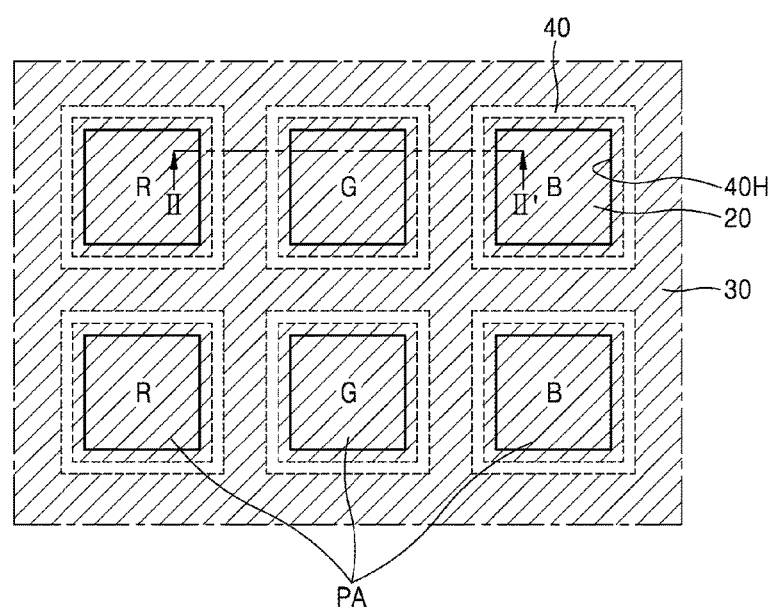
FIG. 1 is schematic plan view of a display apparatus, according to an example embodiment.

As the disclosure allows for various changes and numerous example embodiments, particular example embodiments will be illustrated in the drawings and described in detail in the written description. Effects and features of the disclosure and methods of accomplishing the same may be understood more readily by referencing the following detailed description of preferred example embodiments and the accompanying drawings. The disclosure may, however, be embodied in many different forms and should not be construed as being limited to the example embodiments set forth herein. As used herein, the term "and/or" includes any and all combinations of one or more of the associated listed items. Expressions such as "at least one of," when preceding a list of elements, modify the entire list of elements and do not modify the individual elements of the list.

Reference will now be made in detail to example embodiments, which are illustrated in the accompanying drawings, wherein like reference numerals refer to like elements throughout, and redundant descriptions thereof are not provided here.

While terms such as "first," "second," etc., may be used to describe various components, such components are not limited to the above terms. The above terms are used only to distinguish one component from another.

Throughout the specification, an expression used in the singular encompasses the expression of the plural, unless it has a clearly different meaning in the context.

Throughout the specification, it is to be understood that the terms such as "including" or "having," etc., are intended to indicate the existence of the features or components disclosed in the specification, and are not intended to preclude the possibility that one or more other features or components may exist or may be added.

In the drawings, for convenience of description, the thicknesses of elements may be exaggerated for clarity. For example, the thicknesses and sizes of elements in the drawings are arbitrarily shown for convenience of description; thus, the spirit and scope of the present disclosure are not necessarily defined by the drawings.

Figure 2:
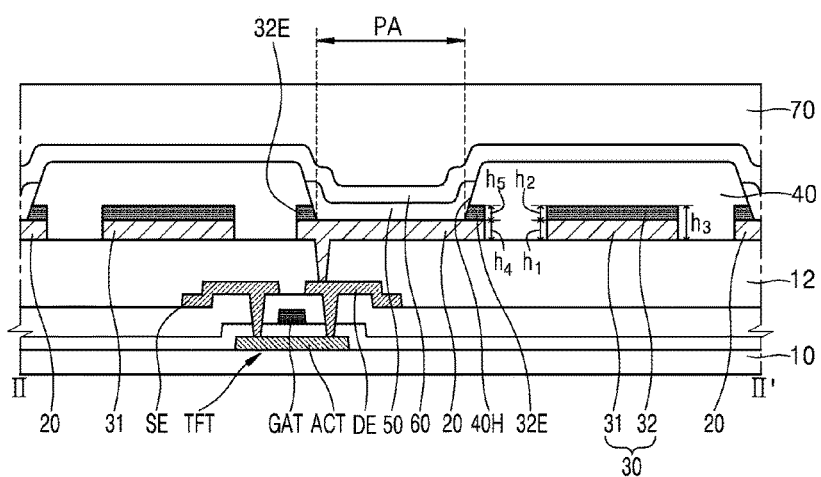
FIG. 2 is a cross-sectional view taken along a line II-II' of FIG. 1.

FIG. 1 is schematic plan view of a display apparatus, according to an example embodiment. FIG. 2 is a cross-sectional view taken along a line II-II' of FIG. 1.

Referring to FIGS. 1 and 2, the display apparatus according to an example embodiment may include a substrate 10, a pixel electrode 20 above the substrate 10, a lower layer 31 spaced apart from the pixel electrode 20 at the same layer and having conductivity, a first low reflection layer 30 including an upper layer 32 above the lower layer 31, a pixel-defining layer 40 above the first low reflection layer 30 and having an opening 40H exposing at least a part of the pixel electrode 20, an intermediate layer 50 above the pixel electrode 20 and including an emission layer, and an opposite layer 60 above the intermediate layer 50.

The substrate 10 may include a display area on which an image is implemented and a peripheral area outside the display area and may include various materials such as a glass material, a metal material, or a plastic material.

A buffer layer (not shown) may be above the substrate 10, the buffer layer including inorganic materials such as silicon oxide, silicon nitride, and/or silicon oxynitride. The buffer layer (not shown) may increase flatness of an upper surface of the substrate 10 or may prevent or minimize penetration of impurities from the substrate 10 into an active layer of a thin film transistor TFT. The buffer layer (not shown) may be omitted according to circumstances.

The thin film transistor TFT may be above the substrate 10 to control whether each of a plurality of pixels emits light. The thin film transistor TFT may include an active layer ACT, a gate electrode GAT insulated from the active layer ACT, and a source electrode SE and a drain electrode DE that are electrically connected to the active layer ACT, the active layer ACT including a semiconductor material such as amorphous silicon, polysilicon, an oxide semiconductor, or an organic semiconductor material.

A via insulating layer 12 may be above the thin film transistor TFT and cover the thin film transistor TFT. The via insulating layer 12 may have a flat upper surface on which the pixel electrode 20 may be formed flat. The via insulating layer 12 may include an organic material such as acryl, benzocyclobutene (BCB), polyimide (PI), or hexamethyld-isiloxane (HMDSO).

The pixel electrode 20 may be above the via insulating layer 12 and may be electrically connected to the thin film transistor TFT. The pixel electrode 20 may be arranged in each pixel in an island shape. The lower layer 31 of the first low reflection layer 30 may be at the same layer as the pixel electrode 20. The lower layer 31 may have conductivity. The lower layer 31 may include the same material as the pixel electrode 20. Referring to FIG. 1, the lower layer 31 may have a mesh shape on a plane.

The pixel electrode 20 and the lower layer 31 may include a light reflection material and may include a reflection layer including silver (Ag), magnesium (Mg), aluminum (Al), platinum (Pt), gold (Au), nickel (Ni), neodymium (Nd), iridium (Ir), chromium (Cr), and combinations thereof and a transparent conductive layer arranged in an upper portion and/or a lower portion of the reflection layer. The transparent conductive layer may include at least one selected from the group consisting of ITO, IZO, ZnO, $In_2O_3$, IGO, and AZO. However, the present disclosure is not limited thereto. The pixel electrode 20 and the lower layer 31 may include various materials and may have a single-layer structure or a multilayer structure.

The upper layer 32 may be above the lower layer 31. The lower layer 31 and the upper layer 32 may constitute the first low reflection layer 30. The first low reflection layer 30 may reduce an external light reflectance of the display apparatus. The first low reflection layer 30 may perform a low reflection function by stacking a plurality of material layers having different refractive indexes and allowing light reflected from each interface to be offset and destructively interfere. This will be described later. The first low reflection layer 30 may have low reflectance to show a black color. According to another example embodiment, the upper layer 32 of the first low reflection layer 30 may be only above the lower layer 31 and may not be above the pixel electrode 20.

According to an embodiment, a height of the first low reflection layer 30 may be greater than a height $h_4$ of the pixel electrode 20. Referring to FIG. 2, the lower layer 31 may have a height $h_1$. The upper layer 32 having a height $h_2$ may be above the lower layer 31. In this regard, a sum of the heights of the lower layer 31 and the upper layer 32, i.e., a height $h_3=(h_1+h_2)$ of the first low reflection layer 30, may be greater than a height $h_4$ of the pixel electrode 20. As will be described later, the lower layer 31 and the pixel electrode 20 may be formed by the same process, and thus the height $h_4$ of the pixel electrode 20 may be substantially the same as the height $h_1$ of the lower layer 31. As will be described later, the upper layer 32 and a low reflection etching layer 32E may be formed by the same process, and thus a height $h_5$ of the low reflection etching layer 32E above an edge of the pixel electrode 20 may be substantially the same as the height $h_2$ of the upper layer 32.

The pixel-defining layer 40 may be above the first low reflection layer 30 and may have an opening 40H exposing at least a part of the pixel electrode 20. The pixel-defining layer 40 may include an organic material such as PI or HMDSO but is not limited thereto. The pixel-defining layer 40 may have a single layer structure or a multilayer structure. The pixel-defining layer 40 may define a pixel area PA. For example, the pixel area PA may be defined as an area exposing the pixel electrode 20 by the opening 40H of the pixel-defining layer 40.

The intermediate layer 50 may be above the pixel electrode 20 exposed by the pixel-defining layer 40 and may include at least one common layer and an organic emission layer. The organic emission layer may include various organic materials including copper phthalocyanine (CuPc), N,N'-Di(naphthalene-1-yl)-N,N'-diphenyl-benzidine (NPB), tris-8-hydroxyquinoline alum inum)(Alq3), and the like.

The opposite electrode 60 may be above the intermediate layer 50. The opposite electrode 60 may be formed as one body over a plurality of pixels, unlike the pixel electrode 20. If a gate-ON signal is applied to the thin film transistor TFT, a voltage difference may occur between the pixel electrode 20 and the opposite electrode 60, and thus electrons and holes may meet in the organic emission layer of the intermediate layer 50 and generate light. The opposite electrode 60 may be a translucent electrode and may include metal having a thin film shape having a thickness of several nanometers to several tens of nanometers to allow light to pass through. For example, the opposite electrode 60 may include Ag, Al, Mg, Li, Ca, Cu, LiF/Ca, LiF/Al, MgAg, or CaAg. However, a structure and material of the opposite electrode 60 are not limited thereto and may vary.

The display apparatus according to an embodiment may be a top-emission type display apparatus in which light emitted from the organic emission layer passes through the opposite electrode 60 to the outside of the display apparatus.

Figure 3:
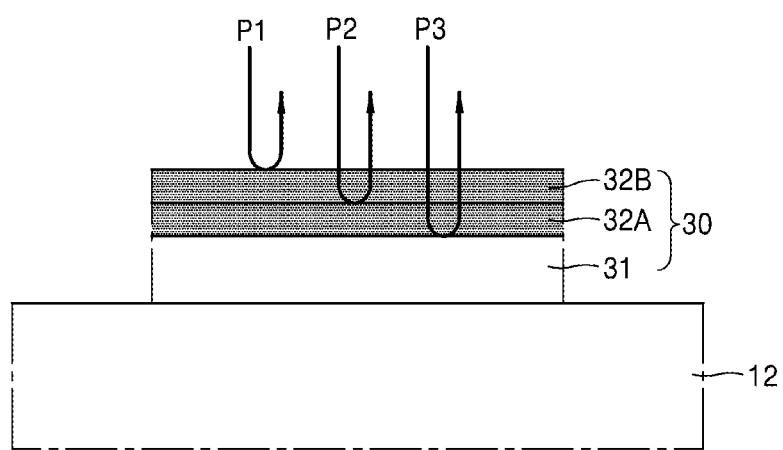
FIGS. 3 and 4 are respectively cross-sectional views of a first low reflection layer of FIG. 2, according to an example embodiment.
Figure 4:
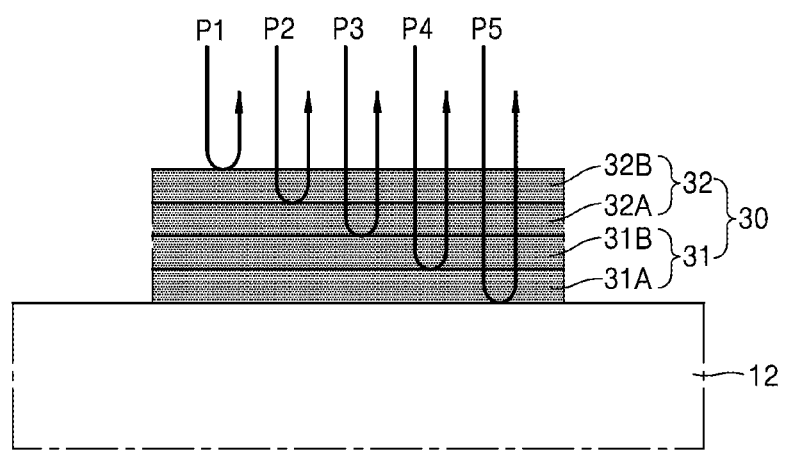

FIGS. 3 and 4 are respectively cross-sectional views of the first low reflection layer 30 of FIG. 2.

According to an embodiment, the upper layer 32 of the first low reflection layer 30 may include a plurality of layers having different refractive indexes. Light reflected from a boundary surface between the pixel-defining layer 40 and an uppermost layer among the plurality of layers and light reflected from a boundary surface between the plurality of layers may destructively interfere with each other.

Referring to FIG. 3, the upper layer 32 of the first low reflection layer 30 may include, for example, two layers 32A and 32B having different refractive indexes. Supposing that a path of light reflected from a boundary surface of the pixel-defining layer 40 and the top layer 32B of the upper layer 32 is P1, a path of light reflected from a boundary surface of the top layer 32B and the bottom layer 32A of the upper layer 32 is P2, and a path of light reflected from a boundary surface of the upper layer 32 and the lower layer 31 is P3, refractive indexes and thicknesses of the layers 32A and 32B included in the upper layer 32 may be adjusted, thereby allowing light due to path differences of P1, P2, and P3 to be offset from each other. That is, reflectance of light incident from outside of a display apparatus may be reduced by the upper layer 32 above the lower layer 31. In this case, the upper layer 32 may show a black color.

Referring to FIG. 4, refractive indexes and thicknesses of layers included in the upper layer 32 and the lower layer 31 may be adjusted, and thus the upper layer 32 and the lower layer 31 may show a black color as a whole. For example, the lower layer 31 arranged at the same layer as the pixel electrode 20 may include two layers 31A and 31B.

In this regard, supposing that the path of the light incident from outside of the display apparatus and reflected from the boundary surface of the pixel-defining layer 40 and the top layer 32B of the upper layer 32 is P1, the path of the light reflected from the boundary surface of the top layer 32B and the bottom layer 32A of the upper layer 32 is P2, the path of the light reflected from the boundary surface of the upper layer 32 and the lower layer 31 is P3, a path of light reflected from a boundary surface of the top layer 31B and the bottom layer 31A of the lower layer 31 is P4, and a path of light reflected from the bottom layer 31A of the lower layer 31 and the via insulating layer 12 is P5, refractive indexes and thicknesses of the layers 31A, 31B, 32A, and 32B included in the lower layer 31 and the upper layer 32 may be adjusted, thereby generating maximum destructive interference of light due to path differences of P1, P2, P3, P4, and P5. That is, reflectance of external light may be reduced by the lower layer 31 and the upper layer 32. In this case, the first low reflection layer 30 may show a black color as a whole. In this case, refractive indexes and thicknesses of all the layers 31A, 31B, 32A, and 32B included in the lower layer 31 and the upper layer 32 may be adjusted, and thus reflectance of the first low reflection layer 30 may be reduced as a whole. Thus, if only the lower layer 31 is separately arranged, the lower layer 31 may not show a black color. Therefore, the pixel electrode 20 including the same material as the lower layer 31 at the same layer as the lower layer 31 may not show the black color.

According to an embodiment, reflectance of the upper layer 32 of the first low reflection layer 30 may be equal to or less than about 6%. Reflectance means a ratio of intensity of reflection light with respect to incidence light, and thus the reflectance of the upper layer 32 may be equal to or greater than 0%.

The display apparatus according to an example embodiment may further include a low reflection etching layer 32E between the pixel-defining layer 40 and an edge of the pixel electrode 20, wherein the pixel-defining layer 40 covers the edge of the pixel electrode 20. This will be described later in connection with a method of manufacturing the display apparatus.

According to an embodiment, the upper layer 32 of the first low reflection layer 30 may include a stack structure of aluminum (Al)/aluminum oxide (AlO$_x$)/titanium (Ti), a stack structure of aluminum (Al)/titanium (Ti)/indium zinc oxide (IZO)/titanium (Ti), or a stack structure of copper (Cu)/indium tin oxide (ITO)/copper oxide (Cu$_2$O).

According to an embodiment, the first low reflection layer 30 may be electrically grounded. When the first low reflection layer 30 is electrically grounded, abnormal driving characteristics of the display apparatus may be prevented.

The display apparatus including the first low reflection layer 30 may not need a black matrix layer and/or a circular polarizer in a non-pixel area to prevent reflection of external light, and thus a thickness of the display apparatus may be reduced. Thus, a folding characteristic of the display apparatus may be enhanced. A white angular dependency (WAD), in which a color of white light changes due to a color shift according to a viewing angle, may also be reduced.

A display apparatus further including a thin film encapsulation layer 70 and a touch panel TP will be described below.

Figure 5:
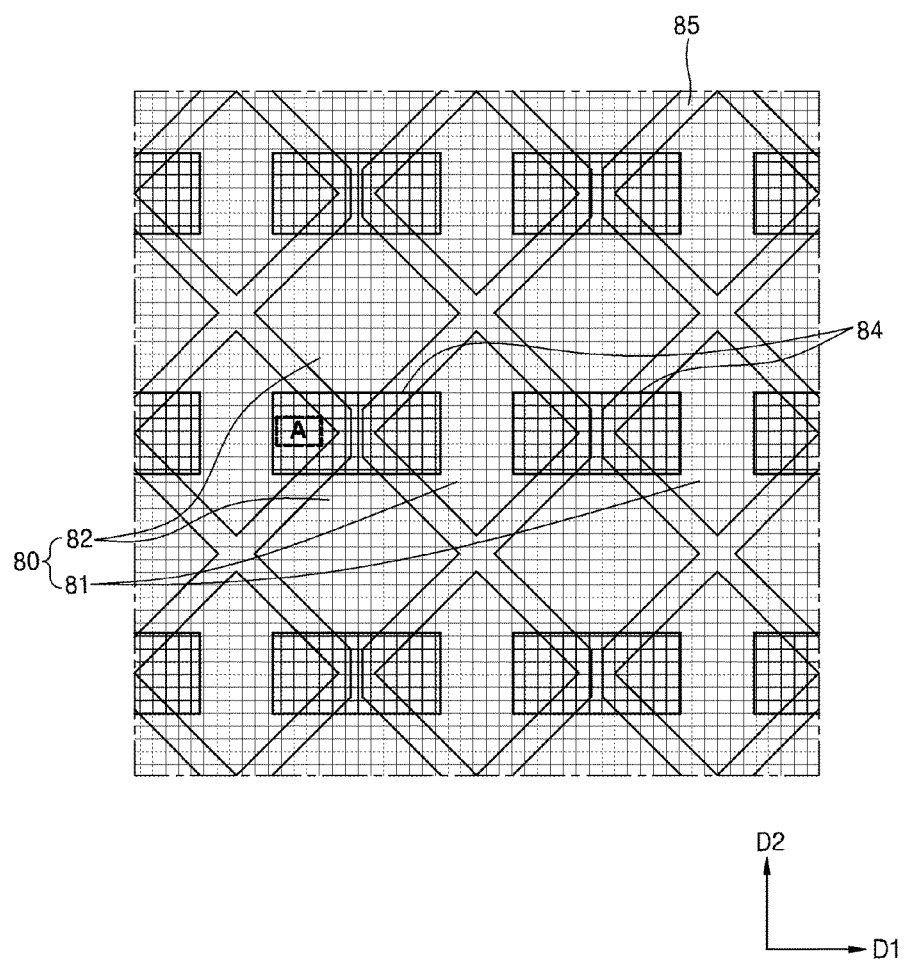
FIG. 5 is a plan view of a detection electrode and a bridge of a partial area of a display apparatus, according to an example embodiment.
Figure 6:
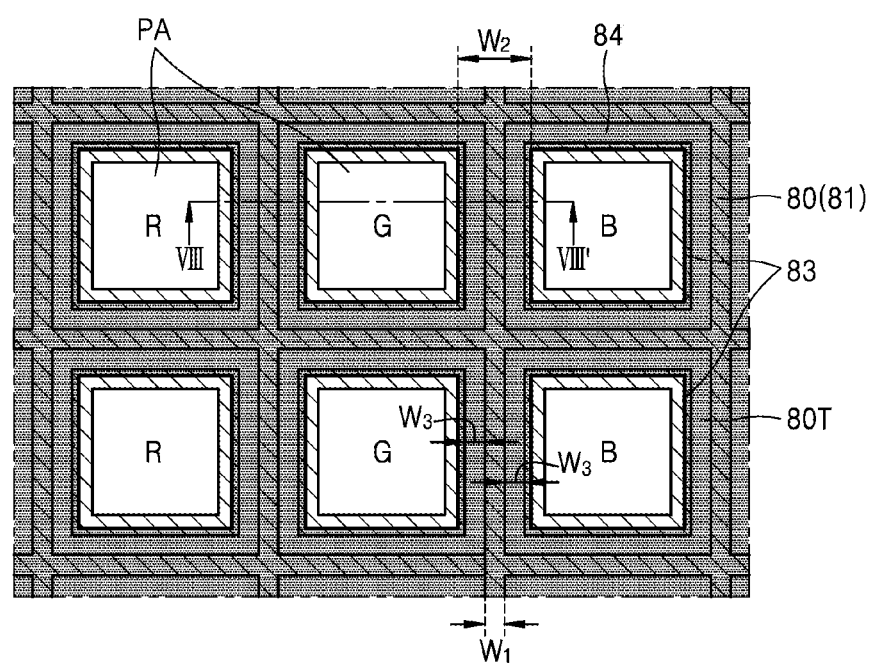
FIG. 6 is an enlarged plan view of region A of FIG. 5.
Figure 7:
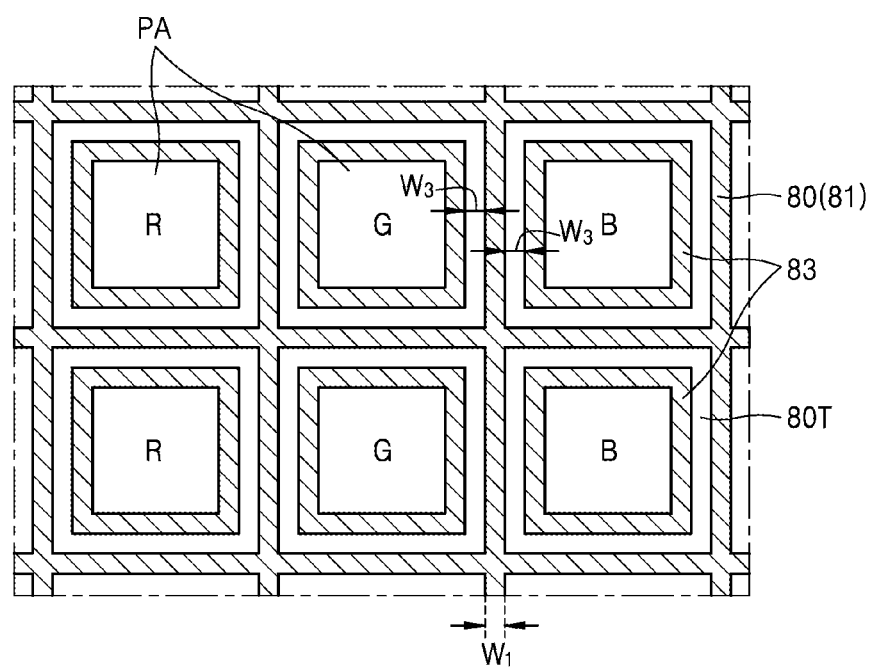
FIG. 7 is a plan view of a detection electrode and a second low reflection layer that are included in FIG. 6.
Figure 8:
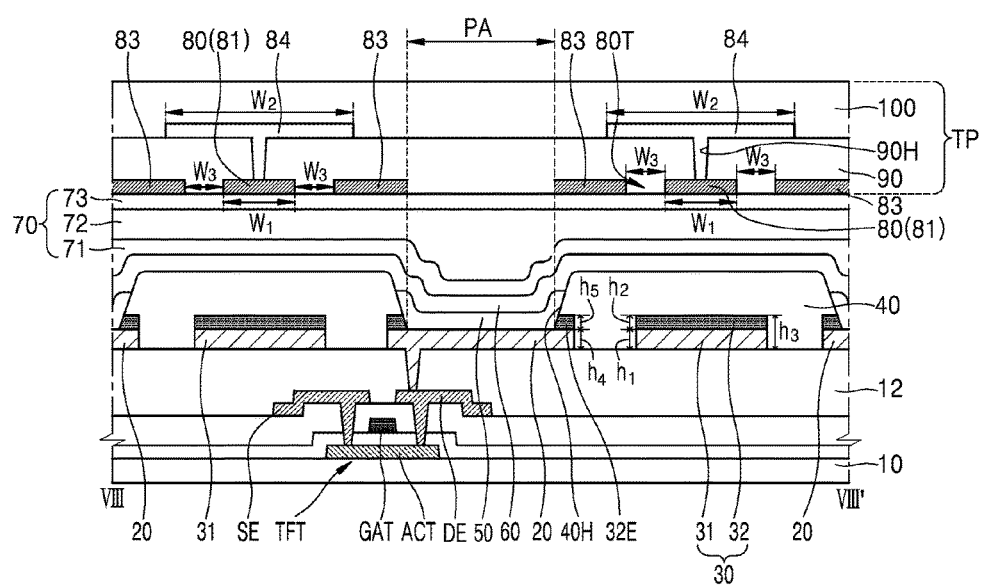
FIG. 8 is a cross-sectional view taken along a line VIII-VIII' of FIG. 6.

FIG. 5 is a plan view of a detection electrode 80 and a bridge 84 of a partial area of a display apparatus, according to an example embodiment. FIG. 6 is an enlarged plan view of region A of FIG. 5. FIG. 7 is a plan view of the detection electrode 80 and a second low reflection layer 83 that are included in FIG. 6. FIG. 8 is a cross-sectional view taken along a line VIII-VIII' of FIG. 6.

The display apparatus according to an example embodiment may further include the thin film encapsulation layer 70 above the opposite electrode 60 at least one inorganic layer and the touch panel T above the thin film encapsulation layer 70, the thin film encapsulation layer 70 including at least one inorganic layer, for example, inorganic layers 71 and 73, and at least one organic layer 72.

The display apparatus according to an example embodiment may further include the touch panel TP for detecting a touch of a user. The touch panel TP may include the detection electrode 80 detecting a touch signal and including a plurality of conductive lines in a grid shape, the second low reflection layer 83 spaced apart from the detection electrode 80 at the same layer and surrounding the pixel electrode 20, the bridge 84 overlapping a part of the detection electrode 80 on a plane, including a plurality of conductive lines in a grid shape, and electrically connected to the detection electrode 80, and an insulating layer 90 between the bridge 84 and the detection electrode 80 and having an opening 90H through which the bridge 84 and the detection electrode 80 are electrically connected to each other.

Referring to FIG. 5, the detection electrode 80 may include a plurality of first detection electrodes 81 and a plurality of second detection electrodes 82, which cross each other. The plurality of first detection electrodes 81 may be formed long in a first direction D1 and may be aligned in a second direction D2 crossing the first direction D1. The plurality of second detection electrodes 82 may be formed long in the second direction D2 and may be aligned in the first direction D1.

The second detection electrodes 82 may be connected to each other on a plane, whereas the first detection electrodes 81 may be physically separated from each other. However, the first detection electrodes 81 may be electrically connected by the bridge 84 arranged in a different layer.

The insulating layer 90 may be between the bridge 84 and the detection electrode 80. The insulating layer 90 may be between the second detection electrodes 82 and the bridge 84 to insulate the second detection electrodes 82 and the bridge 84 from each other. The opening 90H of the insulating layer 90 may be formed in a part of an area in which the bridge 84 and the first detection electrode 81 overlap such that the first detection electrodes 81 are buried in the opening 90H and are electrically connected to the bridge 84.

If a human's finger or an object such as a stylus pen contacts the display apparatus including the above-described detection electrode 80, a capacitance change due to a contact location may be provided to a driving circuit side from the first and second detection electrodes 81 and 82 via outside wirings (not shown) and pads (not shown) that are connected to the first and second detection electrodes 81 and 82. Next, the capacitance change may be converted into an electrical signal by X and Y input processing circuits (not shown), and thus the contact location may be obtained.

The detection electrode 80 and the bridge 84 may have a structure in which the plurality of conductive lines cross in the grid shape. That is, the detection electrode 80 and the bridge 84 may have a metal mesh pattern in a net shape. In this regard, an alignment shape of the conductive lines is not limited to an orthogonal shape. The conductive lines may diagonally cross each other or may be linearly bent.

A dummy electrode 85 may be arranged in a space between the first detection electrodes 81 and the second detection electrodes 82. The dummy electrode 85 may also have a metal mesh pattern in a net shape like the detection electrode 80. The detection electrode 80 and the dummy electrode 85 may be physically separated from each other. That is, dense metal meshes of FIG. 5 may not be physically connected to each other but may be disconnected from each other between boundaries of the first detection electrodes 81 and the second detection electrodes 82. Thus, the detection electrode 80 and the dummy electrode 85 may be electrically insulated from each other. The dummy electrode 85 may reduce reflectance of external light in an area overlapping the dummy electrode 85 on a plane.

FIG. 6 is an enlarged plan view of region A of FIG. 5. FIG. 7 is a plan view of the detection electrode 80 and the second low reflection layer 83 that are included in FIG. 6.

Referring to FIG. 7, each of the conductive lines of the detection electrode 80 arranged in the grid shape or the net shape may have a first width $w_1$ and may be arranged in a location overlapping the pixel-defining layer 40. The conductive lines of the detection electrode 80 may not overlap the pixel area PA.

The second low reflection layer 83 may be arranged at the same layer as the detection electrode 80 to surround the pixel area PA. That is, the second low reflection layer 83 may surround the pixel electrode 20 on a plane and may overlap an area covered by the pixel-defining layer 40 of the pixel electrode 20 on a plane. In this regard, the second low reflection layer 83 may have a rectangular frame shape and may be insulated from the detection electrode 80. The plurality of second low reflection layers 83 respectively surrounding the pixel areas PA may be completely separated from each other.

The bridge 84 may be above the detection electrode 80 and the second low reflection layer 83. Referring to FIG. 6, each of the conductive lines of the bridge 84 may have a second width $w_2$ and may be arranged in a location overlapping the pixel-defining layer 40. Each of the conductive lines of the detection electrode 80 may not overlap the pixel area PA.

According to an embodiment, the first width $w_1$ of each of the conductive lines included in the detection electrode 80 may be less than the second width $w_2$ of each of the conductive lines included in the bridge 84. Referring to FIGS. 6 and 8, since the width $w_2$ of each of the conductive lines included in the bridge 84 is greater than the width $w_1$ of each of the conductive lines included in the detection electrode 80, the conductive lines of the detection electrode 80 overlapping the bridge 84 may not be exposed but may be hidden when viewed from above. The conductive lines may hide a trench 80T that is an empty space between each of the conductive lines of the detection electrode 80 and the second low reflection layer 83. That is, the width $w_2$ of each of the conductive lines included in the bridge 84 may be greater than a sum $w_1+2w_3$ of the first width $w_1$ of each of the conductive lines included in the detection electrode 80 and a third width $w_3$ of each of the both trenches 80T. In this case, the trench 80T overlapping the bridge 84 may not be exposed but may be hidden when viewed from the front.

Referring to FIG. 8, the thin film encapsulation layer 70 may be above the opposite electrode 60 and may include the at least one inorganic layer 71 and 73 and the at least one organic layer 72. The thin film encapsulation layer 70 may prevent or reduce penetration of moisture or oxygen from outside into a display area including the plurality of pixel areas PA of the display apparatus.

The detection electrode 80 and the second low reflection layer 83 may be arranged at the same layer above the thin film encapsulation layer 70. The insulating layer 90 may be above the second low reflection layer 83. In this regard, the insulating layer 90 may have the opening 90H in a portion where the bridge 84 and the detection electrode 80 are connected. The bridge 84 may fill the opening 90H of the insulating layer 90 to connect, for example, the first detection electrodes 81 that are adjacent to each other.

According to an embodiment, the detection electrode 80 and the second low reflection layer 83 may include a plurality of layers having different refractive indexes. Lights reflected from interfaces of the plurality of layers may destructively interfere with each other. In this regard, the detection electrode 80 and the second low reflection layer 83 may include a same layer.

Similarly to the first low reflection layer 30 described with reference to FIGS. 3 and 4, refractive indexes and thicknesses of the layers included in the detection electrode 80 and the second low reflection layer 83 may be adjusted, thereby generating maximum destructive interference of the light reflected from interfaces of the plurality of layers included in the second low reflection layer 83 due to path differences. That is, reflectance of external light may be reduced by the second low reflection layer 83. In this case, the detection electrode 80 and the second low reflection layer 83 may show a black color.

According to an embodiment, the detection electrode 80 and the second low reflection layer 83 may include a stack structure of aluminum (Al)/aluminum oxide ($AlO_x$)/titanium (Ti), a stack structure of aluminum (Al)/titanium (Ti)/indium zinc oxide (IZO)/titanium (Ti), or a stack structure of copper (Cu)/indium tin oxide (ITO)/copper oxide ($Cu_2O$).

According to an embodiment, the bridge 84 may include a plurality of layers having different refractive indexes. Lights reflected from interfaces of the plurality of layers may destructively interfere with each other.

In this regard, the bridge 84 may also include a stack structure of aluminum (Al)/aluminum oxide ($AlO_x$)/titanium (Ti), a stack structure of aluminum (Al)/titanium (Ti)/indium zinc oxide (IZO)/titanium (Ti), or a stack structure of copper (Cu)/indium tin oxide (ITO)/copper oxide ($Cu_2O$).

That is, all of the detection electrode 80, the second low reflection layer 83, and the bridge 84 may function as a low reflection layer and may have the same stack structure. Referring to FIG. 8, when all of the detection electrode 80, the second low reflection layer 83, and the bridge 84 function as a low reflection layer, reflectance of external light may be reduced in a portion other than the pixel area PA.

According to an embodiment, the upper layer 32 of the first low reflection layer 30 and the second low reflection layer 83 may have the same stack structure. A plurality of layers included in the upper layer 32 may be the same as the plurality of layers included in the second low reflection layer 83.

Figure 9:
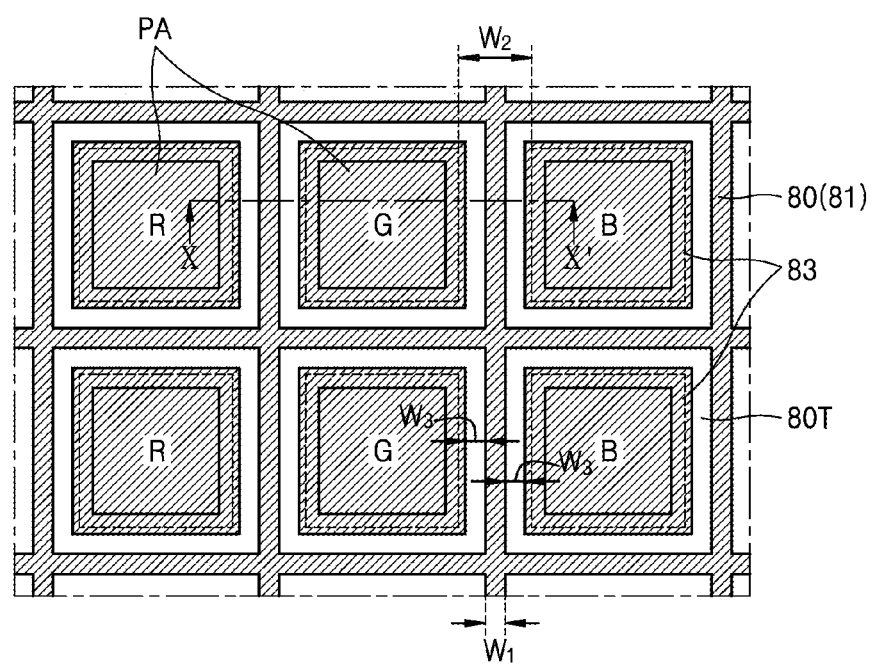
FIG. 9 is a plan view of a display apparatus, according to another example embodiment.
Figure 10:
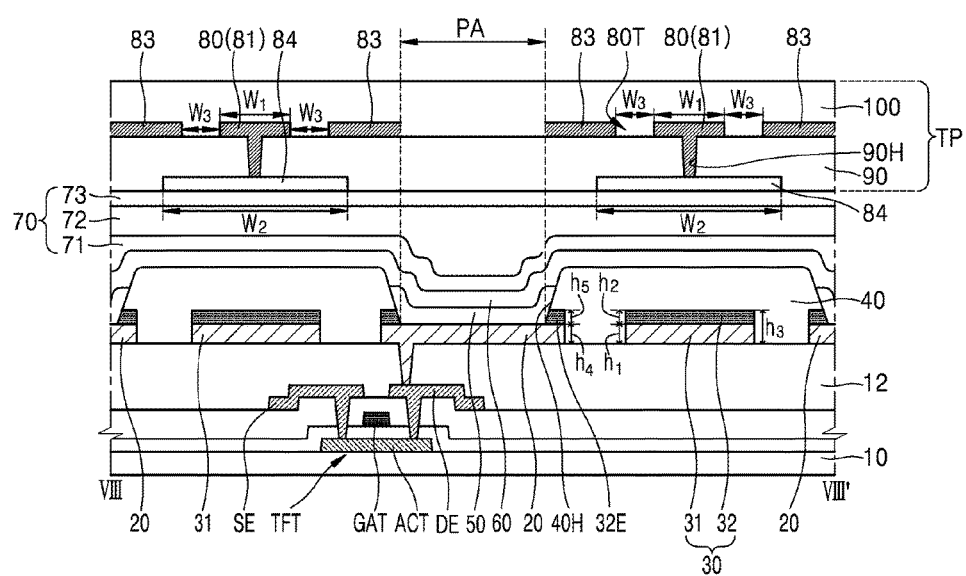
FIG. 10 is a cross-sectional view taken along a line X-X' of FIG. 9.

FIG. 9 is a plan view of a display apparatus, according to another example embodiment. FIG. 10 is a cross-sectional view taken along a line X-X' of FIG. 9. Referring to FIGS. 9 and 10, unlike FIGS. 6 and 8, the bridge 84 may be below the second low reflection layer 83 and the detection electrode 80.

The display apparatus including the above-described second low reflection layer 83 may not need a separate black matrix layer and/or a circular polarizer in a non-pixel area for reflection of external light, and thus a thickness of the display apparatus may be reduced. Thus, a folding characteristic of the display apparatus may be improved. A WAD, in which a color of white light changes due to a color shift according to a viewing angle, may also be reduced.

A method of manufacturing the display apparatus will now be described below.

FIGS. 11A through 11F are cross-sectional views for sequentially describing a method of manufacturing the display apparatus, according to an example embodiment. The method of manufacturing the display apparatus according to an example embodiment may include sequentially forming a conductive layer 20' and a low reflection layer 32' above the substrate 10, forming the first low reflection layer 30 including the lower layer 31 having conductivity and the upper layer 32 above the lower layer 31, the pixel electrode 20, and the low reflection etching layer 32E above the pixel electrode 20 by patterning the conductive layer 20' and the low reflection layer 32', forming the pixel-defining layer 40 above the first low reflection layer 30 and having the opening 40H exposing at least a part of the low reflection etching layer 32E, exposing the pixel electrode 20 by etching at least a part of the low reflection etching layer 32E by using the pixel-defining layer 40 as a mask, forming the intermediate layer 50 including an organic emission layer above the exposed pixel electrode 20, and forming the opposite electrode 60 above the intermediate layer 50.

Figure 11A:
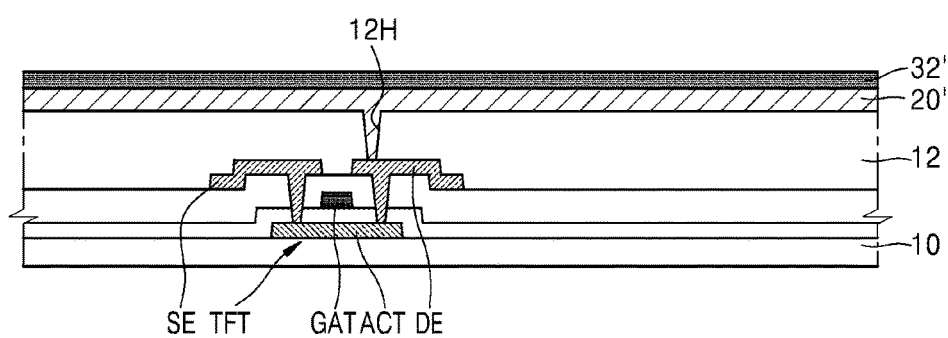
FIGS. 11A, 11B, 11C, 11D, 11E and 11F are cross-sectional views for sequentially describing a method of manufacturing the display apparatus, according to an example embodiment.

Referring to FIG. 11A, after the thin film transistor TFT is formed above the substrate 10, the conductive layer 20' and the low reflection layer 32' may be sequentially formed above the substrate 10. The conductive layer 20' and the low reflection layer 32' may be electrically connected to the thin film transistor TFT via a via hole 12H.

According to an embodiment, an operation of stacking the low reflection layer 32' may include an operation of sequentially stacking a plurality of layers having different refractive indexes. As described with reference to FIGS. 3 and 4 above, refractive indexes and thicknesses of the plurality of layers may be determined such that lights incident from outside and reflected by the low reflection layer 32' destructively interfere with each other.

Figure 11B:
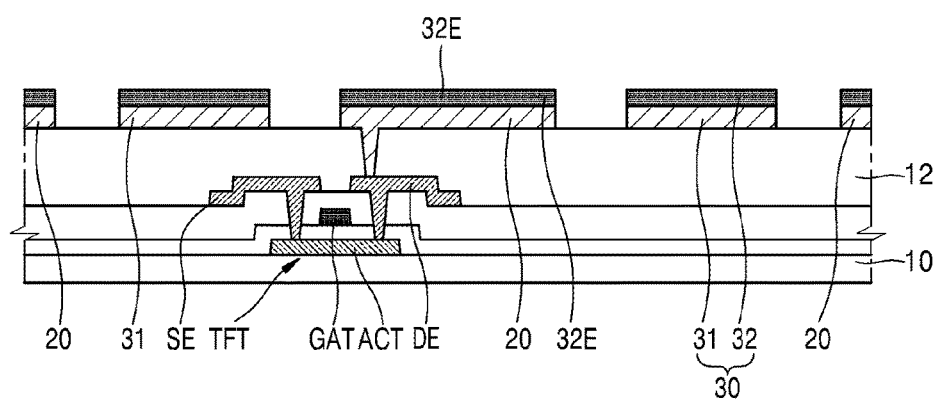

Referring to FIG. 11B, the conductive layer 20' and the low reflection layer 32' may be patterned. Through a patterning process, the pixel electrode 20 and the lower layer 31 of the first low reflection layer 30 spaced apart from the pixel electrode 20 may be formed in a portion electrically connected to the thin film transistor TFT. Simultaneously, the lower reflection etching layer 32E and the upper layer 32 may be respectively formed above the pixel electrode 20 and the lower layer 31 of the first low reflection layer 30. Thus, the first low reflection layer 30 including the lower layer 31 and the upper layer 32 may be formed.

The low reflection etching layer 32E and the upper layer 32 may include a plurality of layers having different refractive indexes. In this regard, lights reflected from boundary surfaces of the plurality of layers may destructively interfere with each other. Thus, the low reflection etching layer 32E and the upper layer 32 may have low reflectance and show a black color. The reflectance of the low reflection etching layer 32E and the upper layer 32 may range from 0% to about 6%.

Figure 11C:
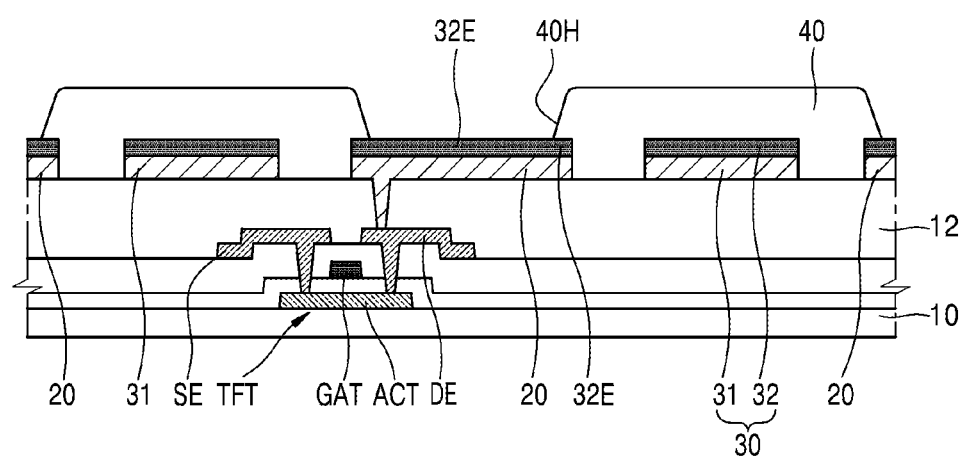

Referring to FIG. 11C, the pixel-defining layer 40 having the opening 40H exposing at least a part of the low reflection etching layer 32E may be formed above the first low reflection layer 30. The pixel-defining layer 40 may cover an edge of the low reflection etching layer 32E and expose a central portion of the low reflection etching layer 32E.

Figure 11D:
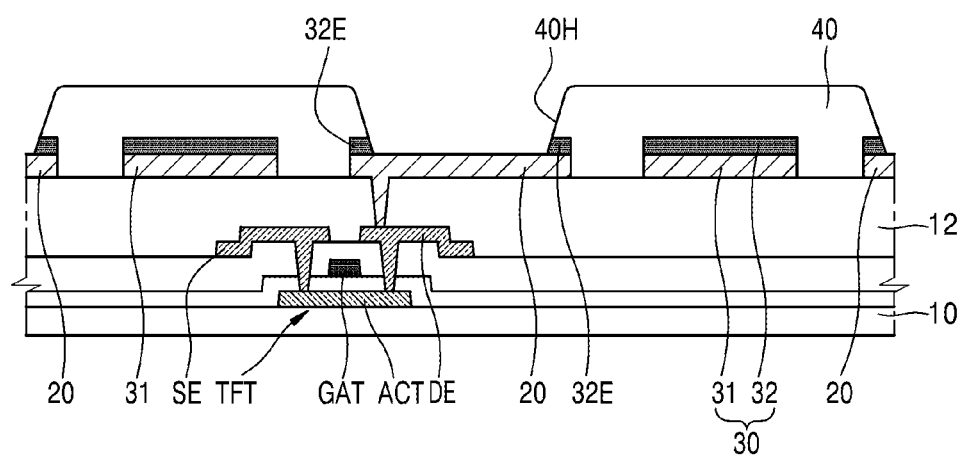

Referring to FIG. 11D, the pixel electrode 20 may be exposed by etching at least a part of the low reflection etching layer 32E by using the pixel-defining layer 40 as the mask. Since the pixel-defining layer 40 originally covers the edge of the low reflection etching layer 32E, the low reflection etching layer 32E covered by the pixel-defining layer 40 may not be etched but may remain during an etching process. Thus, the low reflection etching layer 32E may be above an edge of the pixel electrode 20. Although not shown, the low reflection etching layer 32E may be totally removed during the etching process.

Figure 11E:
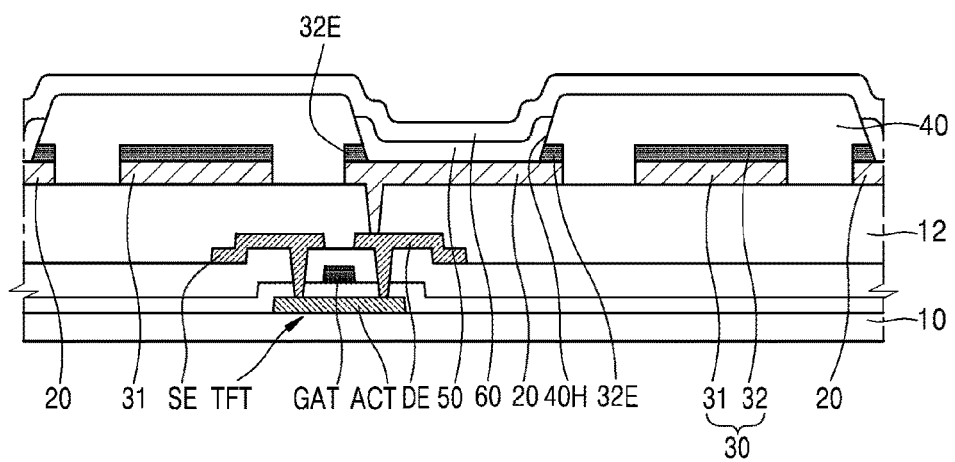

Referring to FIG. 11E, after the pixel-defining layer 40 is formed and the low reflection etching layer 32E is etched, the intermediate layer 50 including the organic emission layer may be formed above the pixel electrode 20, and then the opposite electrode 60 may be formed above the intermediate layer 50.

The intermediate layer 50 may be exposed by the pixel-defining layer 40 and may include at least one common layer and the organic emission layer. The opposite electrode 60 above the intermediate layer 50 may be formed as one body over a plurality of pixels, unlike the pixel electrode 20.

Figure 11F:
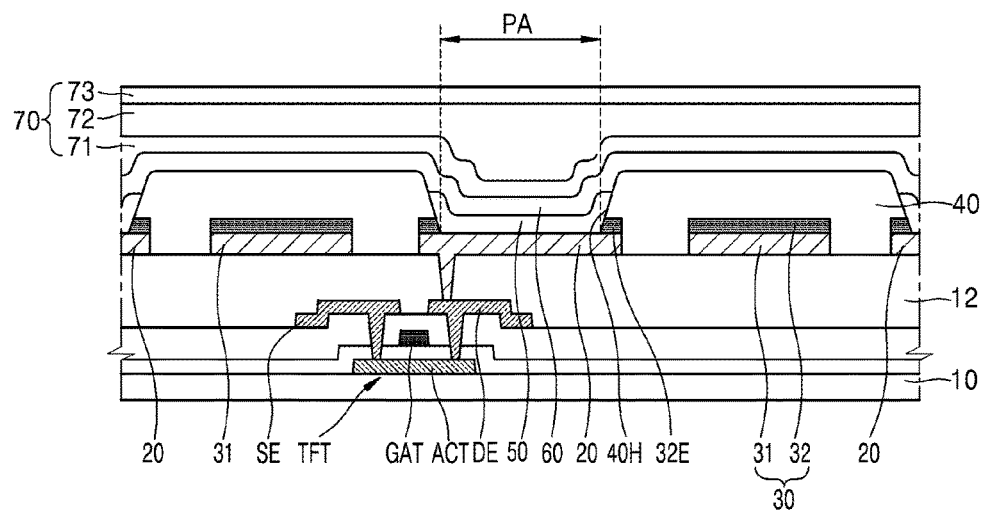

FIG. 11F is a cross-sectional view for describing an operation of forming the thin film encapsulation layer 70.

After the opposite electrode 60 is formed, the thin film encapsulation layer 70 may be formed above the opposite electrode 60. The thin film encapsulation layer 70 may prevent or reduce penetration of moisture or oxygen from outside into a display area.

The thin film encapsulation layer 70 may include the first inorganic layer 71, the organic layer 72, and the second inorganic layer 73 that are sequentially arranged above the opposite electrode 60. The first inorganic layer 71 may include silicon oxide, silicon nitride, and/or silicon oxynitride. The first inorganic layer 71 may be formed according to a structure therebelow, and thus, as shown in FIG. 11F, an upper surface thereof may not be flat. The organic layer 72 may cover the first inorganic layer 71 and may form a flat upper surface. The organic layer 72 may include one or more materials selected from the group consisting of polyethylene terephthalate, polyethylene naphthalate, polycarbonate, polyimide, polyethylene sulfonate, polyoxymethylene, polyarylate, and hexamethyldisiloxane. The second organic layer 73 may cover the organic layer 72 and may include silicon oxide, silicon nitride and/or silicon oxynitride.

According to the method of manufacturing the display apparatus described above, the pixel electrode 20, the lower layer 31, the upper layer 32, and the low reflection etching layer 32E may be formed by one mask, thereby increasing an effect of reflection of external light without increasing a mask process. The method may not need to form a separate black matrix layer and/or circular polarizer in a non-pixel area, thereby reducing a thickness of the display apparatus. A WAD, in which a color of white light changes due to a color shift according to a viewing angle, may also be reduced.

Figure 12A:
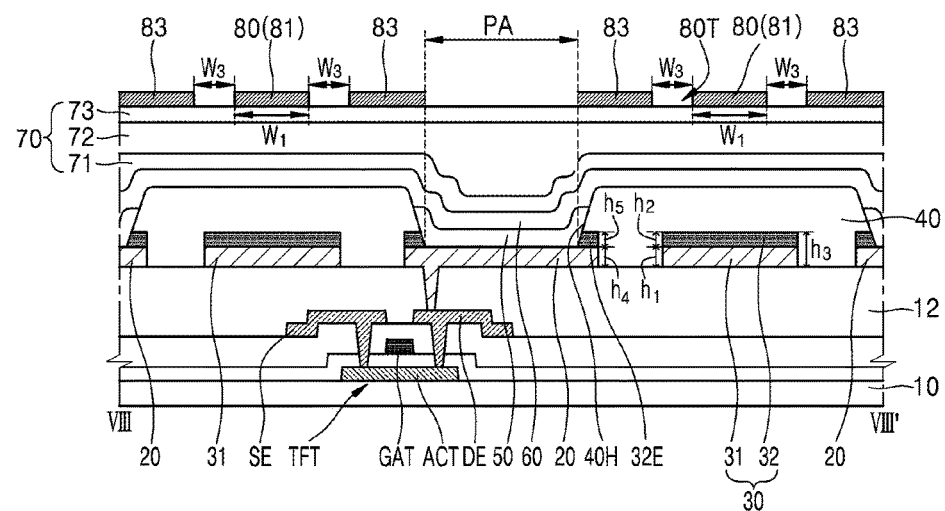
FIGS. 12A, 12B and 12C are cross-sectional views for describing an operation of forming a touch panel in an upper area of a thin film encapsulation layer in a method of manufacturing the display apparatus, according to another example embodiment.
Figure 12B:
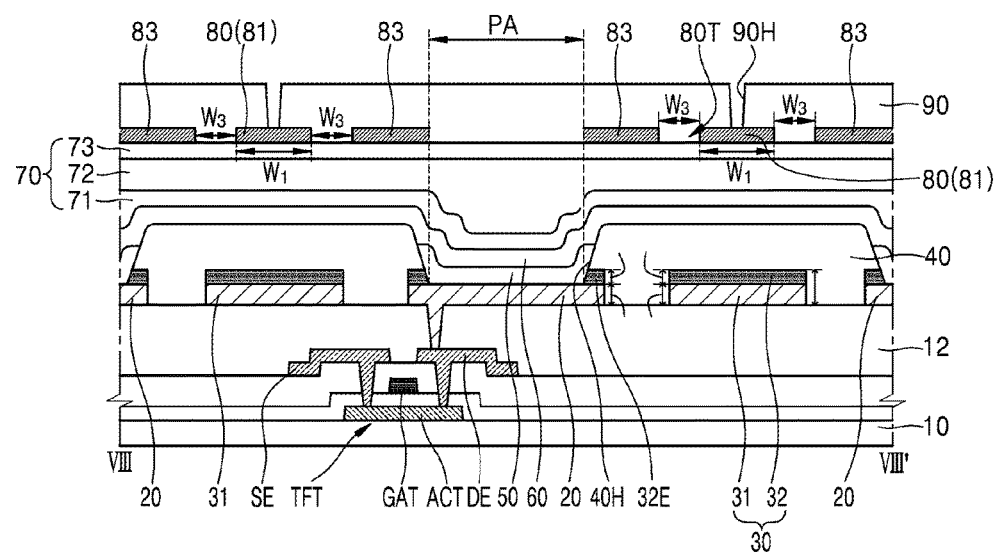
Figure 12C:
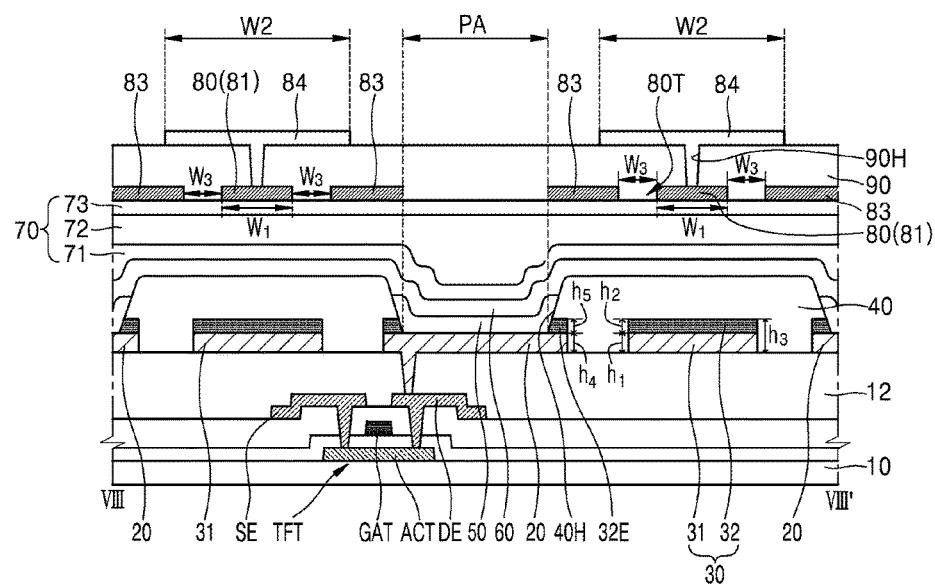

FIGS. 12A through 12C are cross-sectional views for describing an operation of forming the touch panel TP in an upper area of the thin film encapsulation layer 70 among a method of manufacturing the display apparatus, according to another example embodiment.

According to an embodiment, the operation of forming the touch panel TP may further include forming the detection electrode 80 detecting a touch signal and including a plurality of conductive lines in a grid shape and the second low reflection layer 83 surrounding the pixel electrode 20, forming the insulating layer 90 having the opening 90H exposing a part of the detection electrode 80 above the detection 80 and the second low reflection layer 83, and forming the bridge 84 including a plurality of conductive lines in a grid shape, filling the opening 90H of the insulating layer 90, and electrically connected to the detection electrode 80 above the insulating layer 90.

Referring to FIG. 12A, after the thin film encapsulation layer 70 is formed, the detection electrode 80 including the plurality of conductive lines in the grid shape may be formed above the thin film encapsulation layer 70 and the second low reflection layer 83 surrounding the pixel area PA may be formed at the same layer as the detection electrode 80. The detection electrode 80 and the second low reflection layer 83 may include the same material and may be simultaneously formed at the same layer. The detection electrode 80 may detect a touch signal of a user of the display apparatus. The detection electrode 80 may include the plurality of first detection electrodes 81 of FIG. 5 and the plurality of second detection electrodes 82 of FIG. 5, which cross each other.

Referring to FIG. 12B, the insulating layer 90 may be formed above the detection electrode 80 and the second low reflection layer 83. The insulating layer 90 may have the opening 90H in an area overlapping the bridge 84 that will be formed later. The insulating layer 90 may have a single layer structure or a multilayer structure including a transparent inorganic layer or organic layer. The inorganic layer may include one of silicon oxide ($SiO_x$), silicon nitride ($SiN_x$), silicon oxynitride (SiON), and oxide aluminum ($AlO_x$).

Referring to FIG. 12C, the bridge 84 overlapping a part of the detection electrode 80 on a plane and including a plurality of conductive lines in a grid shape may be formed above the insulating layer 90. The bridge 84 may fill the opening 90H of the insulating layer 90 and may be electrically connected to the detection electrode 80. The bridge 84 may connect, for example, the first detection electrodes 81 that are spaced apart from and neighboring each other to deliver an electrical signal in the first direction D1 of FIG. 5.

According to an embodiment, an operation of forming the detection electrode 80 and the second low reflection layer 83 may include an operation of sequentially stacking a plurality of layers having different refractive indexes. In this regard, lights reflected from boundary surfaces of the plurality of layers included in the detection electrode 80 and the second low reflection layer 83 may destructively interfere with each other.

According to an embodiment, an operation of forming the bridge 84 may include an operation of sequentially stacking a plurality of layers having different refractive indexes. In this regard, lights reflected from boundary surfaces of the plurality of layers included in the bridge 84 may destructively interfere with each other.

Referring to FIG. 10, a passivation layer 100 may be formed above the bridge 84. The passivation layer 100 may protect the detection electrode 80. The passivation layer 100 may have a single layer structure or a multilayer structure including a transparent inorganic layer or organic layer. The inorganic layer may include one of silicon oxide ($SiO_x$), silicon nitride ($SiN_x$), silicon oxynitride (SiON), and oxide aluminum ($AlO_x$).

According to the method of manufacturing the display apparatus described above, the detection electrode 80 and the second low reflection layer 83 may be formed by one mask, thereby increasing an effect of reflection of external light without an increase of a mask process. The method may not need to form a separate black matrix layer and/or circular polarizer in a non-pixel area for reflection of external light, thereby reducing a thickness of the display apparatus. Thus, a folding characteristic of the display apparatus may be improved. A WAD, in which a color of white light changes due to a color shift according to a viewing angle, may also be reduced.

As described above, according to the display apparatus and the method of manufacturing the display apparatus according to an embodiment of the present disclosure, a circular polarizer and/or a black matrix that are used to reflect external light may not be necessarily formed, and thus a thickness of the display apparatus may be reduced, a folding characteristic of the display apparatus may be enhanced, and a color shift according to a viewing angle may be reduced. However, the scope of the present disclosure is not limited to the effect.

While one or more example embodiments have been described with reference to the figures, it will be understood by one of ordinary skill in the art that various changes in form and details may be made therein without departing from the spirit and scope as defined by the following claims.

What is claimed is:

1. A display apparatus comprising:
   a substrate;
   a pixel electrode above the substrate;
   a first low reflection layer spaced apart from the pixel electrode at a same layer as the pixel electrode and comprising a lower layer having conductivity and an upper layer above the lower layer;
   a pixel-defining layer above the first low reflection layer and having an opening exposing at least a part of the pixel electrode;
   an intermediate layer above the pixel electrode and comprising an organic emission layer; and
   an opposite electrode above the intermediate layer,
   a low reflection etching layer between an edge of the pixel electrode and the pixel-defining layer.

2. The display apparatus of claim 1, wherein a height of the first low reflection layer is greater than a height of the pixel electrode.

3. The display apparatus of claim 1, wherein the upper layer of the first low reflection layer comprises a plurality of layers having different refractive indexes.

4. The display apparatus of claim 3, wherein light reflected from a boundary surface between the pixel-defining layer and an uppermost layer among the plurality of layers and light reflected from a boundary surface between the plurality of layers destructively interfere with each other.

5. The display apparatus of claim 1, wherein the reflectance of the upper layer of the first low reflection layer is less than about 6%.

6. The display apparatus of claim 1, wherein
   the low reflection etching layer is between the pixel-defining layer and the edge of the pixel electrode and the intermediate layer,
   wherein the pixel-defining layer overlaps the low reflection etching layer.

7. The display apparatus of claim 1, wherein the upper layer of the first low reflection layer comprises a stack structure of aluminum (Al)/aluminum oxide (AlOx)/titanium (Ti), a stack structure of aluminum (Al)/titanium (Ti)/indium zinc oxide (IZO)/titanium (Ti), or a stack structure of copper (Cu)/indium tin oxide (ITO)/copper oxide (Cu2O).

8. The display apparatus of claim 1, wherein the first low reflection layer is electrically grounded.

9. The display apparatus of claim 1, further comprising:
a thin film encapsulation layer above the opposite electrode and comprising at least one inorganic layer and at least one organic layer; and
a touch panel above the thin film encapsulation layer.

10. The display apparatus of claim 9, wherein the touch panel comprises:
a detection electrode detecting a touch signal and comprising a plurality of conductive lines in a grid shape;
a second low reflection layer spaced apart from the detection electrode at a same layer as the detection electrode and surrounding the pixel electrode;
a bridge overlapping a part of the detection electrode on a plane, comprising a plurality of conductive lines in a grid shape, and electrically connected to the detection electrode; and
an insulating layer between the bridge and the detection electrode and having an opening through which the bridge and the detection electrode are electrically connected to each other.

11. The display apparatus of claim 10, wherein widths of the plurality of conductive lines included in the detection electrode are less than widths of the plurality of conductive lines included in the bridge.

12. The display apparatus of claim 10, wherein the detection electrode and the second low reflection layer comprise a plurality of layers having refractive indexes,
wherein lights reflected from boundary surfaces of the plurality of layers destructively interfere with each other.

13. The display apparatus of claim 12, wherein the detection electrode and the second low reflection layer comprise a stack structure of aluminum (Al)/aluminum oxide (AlOx)/titanium (Ti), a stack structure of aluminum (Al)/titanium (Ti)/indium zinc oxide (IZO)/titanium (Ti), or a stack structure of copper (Cu)/indium tin oxide (ITO)/copper oxide (Cu2O).

14. The display apparatus of claim 10, wherein the bridge comprises a plurality of layers having refractive indexes,
wherein lights reflected from boundary surfaces of the plurality of layers destructively interfere with each other.

* * * * *